United States Patent
Hsu (10) Patent No.: US 10,499,523 B2
(45) Date of Patent: Dec. 3, 2019

(54) FINGERPRINT RECOGNITION MODULE AND MANUFACTURING METHOD THEREFOR

(71) Applicant: Primax Electronics Ltd., Taipei (TW)

(72) Inventor: Chih-Hao Hsu, Taipei (TW)

(73) Assignee: PRIMAX ELECTRONICS LTD., Taipei (TW)

( * ) Notice: Subject to any disclaimer, the term of this patent is extended or adjusted under 35 U.S.C. 154(b) by 145 days.

(21) Appl. No.: 15/814,962

(22) Filed: Nov. 16, 2017

(65) Prior Publication Data
US 2018/0338381 A1 Nov. 22, 2018

(30) Foreign Application Priority Data
May 19, 2017 (TW) .............................. 106116690 A (51) Int. Cl.
| | |
|---|---|
| H05K 3/00 | (2006.01) |
| G06K 9/00 | (2006.01) |
| H05K 5/06 | (2006.01) |
| H05K 3/28 | (2006.01) |
| H05K 1/18 | (2006.01) |

(52) U.S. Cl.
CPC ........... H05K 5/065 (2013.01); G06K 9/0002 (2013.01); H05K 3/0097 (2013.01); H05K 1/181 (2013.01); H05K 3/284 (2013.01); H05K 2201/10151 (2013.01); H05K 2203/1316 (2013.01); H05K 2203/1327 (2013.01)

(58) Field of Classification Search
CPC ............. G06K 9/00006; G06K 9/0002; G06K 9/0004; G06K 9/00053; H01L 23/28; H01L 23/31; H01L 23/3107; H05K 3/284; H05K 2201/10151; H05K 2203/1316; H05K 2203/1327
See application file for complete search history.

(56) References Cited

U.S. PATENT DOCUMENTS

| | | | |
|---|---|---|---|
| 9,946,915 B1* | 4/2018 | Troccoli et al. ...... | G06K 9/0002 |
| 2016/0172264 A1* | 6/2016 | Teng et al. ............ | H01L 23/295 |
| | | | 257/414 |
| 2017/0110416 A1* | 4/2017 | Miao et al. ........... | H01L 23/564 |
| 2017/0142834 A1* | 5/2017 | Hsieh et al. ............. | H05K 1/18 |
| 2017/0162620 A1* | 6/2017 | Wang et al. ......... | G06K 9/0002 |
| 2017/0262692 A1* | 9/2017 | Ghavanini ........... | G06K 9/0002 |
| 2018/0046837 A1* | 2/2018 | Gozzini et al. ...... | G06K 9/0004 |
| 2018/0076268 A1* | 3/2018 | Wang et al. ............. | G06K 9/00 |
| 2018/0138103 A1* | 5/2018 | Lu ....................... | H01L 23/3142 |

* cited by examiner

*Primary Examiner* — Andrew W Johns (74) *Attorney, Agent, or Firm* — Muncy, Geissler, Olds & Lowe, P.C.

(57) ABSTRACT

The present invention provides a fingerprint recognition module, including: a substrate, a fingerprint sensing die fixed on the substrate, an encapsulation layer covering the fingerprint sensing die and the substrate, the encapsulation layer having a composition plane, and an imprint layer, where the imprint layer is formed on the composition plane.

11 Claims, 8 Drawing Sheets

FINGERPRINT RECOGNITION MODULE AND MANUFACTURING METHOD THEREFOR

FIELD OF THE INVENTION

The present invention relates to the application field of an encapsulation process, and in particular, to a method for treating a surface of an encapsulation layer of an electronic component.

BACKGROUND OF THE INVENTION

A fingerprint recognition module has gradually become one of standard configurations of an electronic device, and a user may have his or her identity identified by using the fingerprint recognition module, so as to unlock or control the electronic device. To make the fingerprint recognition module more adaptable to appearance design of various electronic devices, a surface of the recognition module is usually treated in different imprint treatment or surface treatment manners, so that consistency between the fingerprint recognition module embedded in the electronic device and the electronic device is aesthetically pleasing.

Figure 1A:
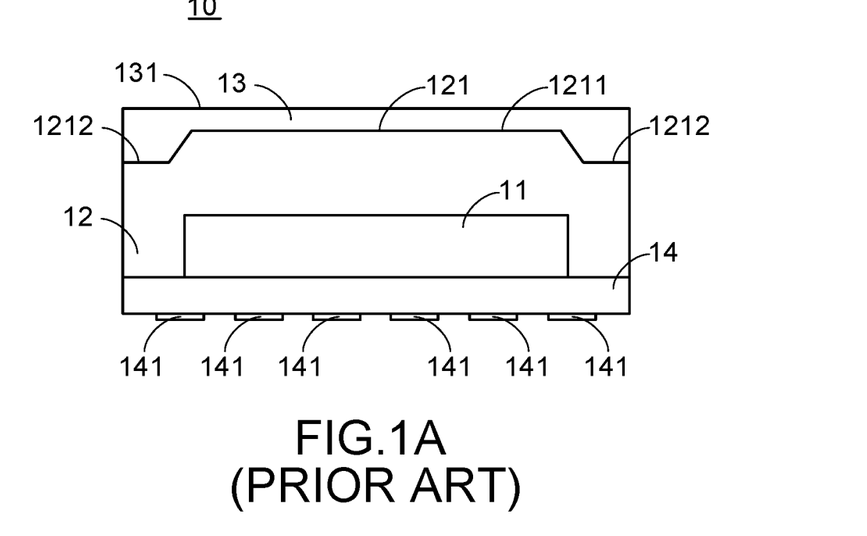
FIG. 1A is a sectional view of a fingerprint recognition module in the prior art.

In the prior art, as shown in FIG. 1A, a fingerprint recognition module 10 usually has a fingerprint sensing die 11, an encapsulation layer 12 encapsulated by an epoxy molding compound (EMC) material, an imprint layer 13, and a substrate 14. The encapsulation layer 12 has an encapsulation layer surface 121, and the encapsulation layer surface 121 has a convex part 1211 and a concave part 1212 resulting from a configuration position of the fingerprint sensing die 11. The imprint layer 13 has an embossing surface 131. The substrate 14 has a plurality of weld legs 141, and the fingerprint recognition module 10 is combined with a printed circuit board (PCB) of an electronic device (not shown in the figure) by using the weld legs 141.

Figure 1B:
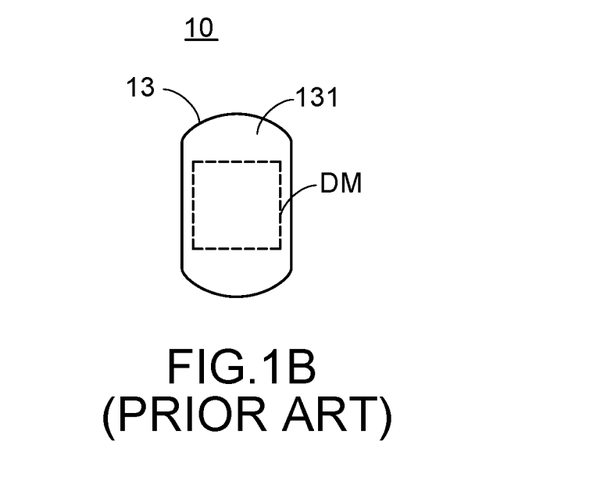
FIG. 1B is a top view of a fingerprint recognition module in the prior art.

Subsequently, since the encapsulation layer surface 121 of the encapsulation layer 12 has the convex part 1211 and the concave part 1212, when the imprint layer 13 is too thin or too transparent, a die mark (DM) (as shown in FIG. 1B) resulting from the convex part 1211 and the concave part 1212 may be seen from the embossing surface 131 of the imprint layer 13, and in this way, an appearance of the fingerprint recognition module may lose aesthetic pleasure of consistency.

In view of this, how to provide a fingerprint recognition module without a die mark is a technical problem that the present invention attempts to resolve.

SUMMARY OF THE INVENTION

A main objective of the present invention is to provide a fingerprint recognition module without a die mark to keep aesthetic pleasure of consistency between the fingerprint recognition module and an electronic device combined with the fingerprint recognition module.

To achieve the foregoing objective, the present invention provides a fingerprint recognition module, including:
  a substrate;
  a fingerprint sensing die, where the fingerprint sensing die is fixed on the substrate;
  an encapsulation layer, where the encapsulation layer covers the fingerprint sensing die and the substrate, and the encapsulation layer has a composition plane; and
  an imprint layer, where the imprint layer is formed on the composition plane.

In the foregoing preferred implementation, the imprint layer has a high-gloss surface, and the high-gloss surface does not have a die mark.

In the foregoing preferred implementation, the encapsulation layer is made of an EMC material.

In the foregoing preferred implementation, the composition plane is formed by means of a plane grinding step.

In the foregoing preferred implementation, a surface of the encapsulation layer has at least one concave part and at least one convex part, and a filling material is filled in the at least one concave part to form the composition plane.

In the foregoing preferred implementation, a material of the filling material is the same as a material of the encapsulation layer.

In the foregoing preferred implementation, a thickness of the encapsulation layer ranges from 0.25 mm to 0.85 mm.

In the foregoing preferred implementation, a thickness of the imprint layer ranges from 28 μm to 44 μm.

In the foregoing preferred implementation, the imprint layer includes: a light-curable ink layer, a heat-curable ink layer, a hybrid ink layer, an ultraviolet-curable resin layer, or a fingerprint-resistant coating layer.

In the foregoing preferred implementation, the substrate has a plurality of weld legs.

Another preferred implementation of the present invention relates to a manufacturing method for a fingerprint recognition module, including the following steps:
  (a). providing a fingerprint sensing die connecting board, where the fingerprint sensing die connecting board has a substrate, an encapsulation layer, and a plurality of fingerprint sensing dies;
  (b). forming a composition plane on a surface of the encapsulation layer;
  (c). forming an imprint layer on the composition plane of the encapsulation layer; and
  (d). cutting the fingerprint sensing die connecting board to form a fingerprint recognition module.

In the foregoing preferred implementation, in step (b), the composition plane is formed by means of a plane grinding step.

In the foregoing preferred implementation, in step (b), a surface of the encapsulation layer has at least one concave part and at least one convex part, and a filling material is filled in the at least one concave part to form the composition plane.

DETAILED DESCRIPTION OF THE PREFERRED EMBODIMENT

Advantages and features of the present invention, and the method therefor described more specifically with reference to exemplary embodiments and accompanying drawings, so as to be understood easier. However, the present invention may be implemented in different manners and should not be interpreted to be limited to the embodiments stated herein. Contrarily, for a person of ordinary skill in the art, these embodiments provided herein enable the disclosure to more thoroughly, comprehensively, and completely convey the scope of the present invention.

Figure 2A:
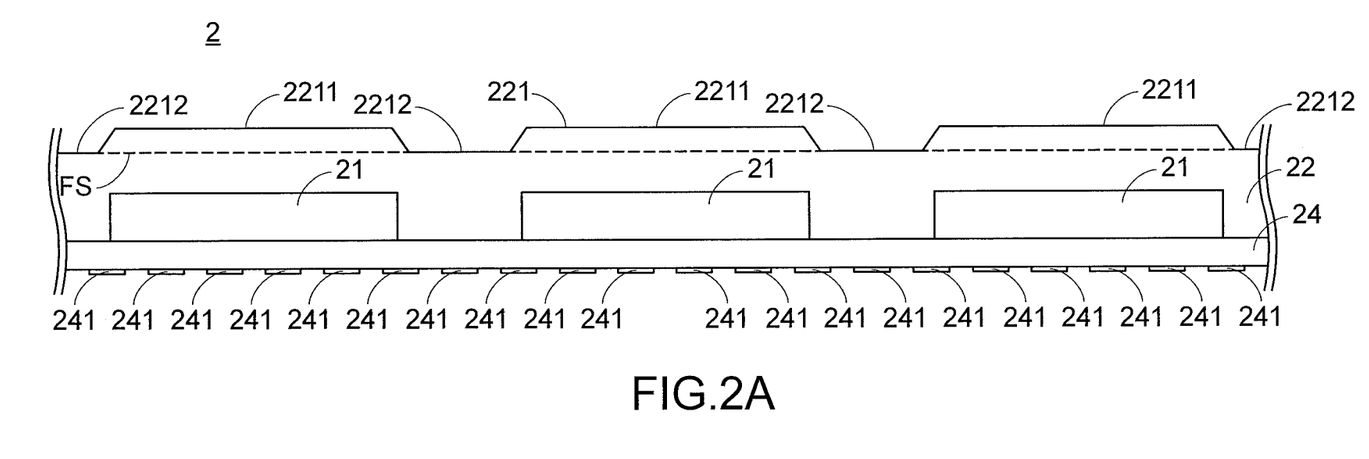
FIG. 2A is a sectional view of a first embodiment of a fingerprint sensing die connecting board according to the present invention.

To manufacture a fingerprint recognition module without a die mark, first referring to FIG. 2A, FIG. 2A is a sectional view of a first embodiment of a fingerprint sensing die connecting board according to the present invention. The fingerprint sensing die connecting board 2 includes: a plurality of fingerprint sensing dies 21, an encapsulation layer 22, and a substrate 24 having a plurality of weld legs 241, where the fingerprint sensing die 21 is fixed on the substrate 24, the encapsulation layer 22 covers the fingerprint sensing die 21 and the substrate 24, the encapsulation layer 22 has a encapsulation layer surface 221, and the encapsulation layer surface 221 has a plurality of convex parts 2211 and a plurality of concave parts 2212 resulting from a configuration position of the fingerprint sensing die 21. Further, a plane grinding step may be performed on the encapsulation layer surface 221 of the fingerprint sensing die connecting board 2 to remove the plurality of convex parts 2211 and the plurality of concave parts 2212, and lower the height of the encapsulation layer surface 221 to a position of a grinding line FS. The encapsulation layer 22 is made of an EMC material or another encapsulation material including silicone or acrylic.

Figure 2B:
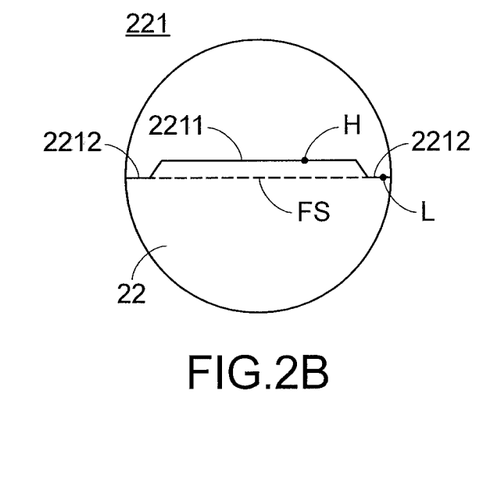
FIG. 2B and FIG. 2C are enlarged partial views of a first embodiment of surface treatment on an encapsulation layer according to the present invention.
Figure 2C:
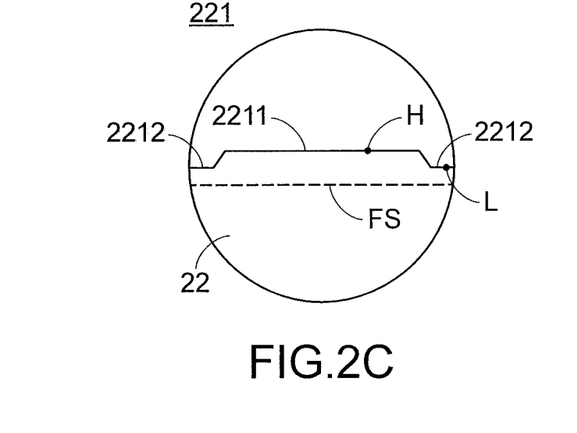

Referring to FIG. 2B and FIG. 2C, FIG. 2B and FIG. 2C are enlarged partial views of a first embodiment of surface treatment on an encapsulation layer according to the present invention. In FIG. 2B, the encapsulation layer surface 221 has a convex part 2211 and a concave part 2212, the convex part 2211 has a highest point H, and the concave part 2212 has a lowest point L. A vertical distance between the highest point H and the lowest point L is equal to or less than 15 µm, and the grinding line FS is flush with the lowest point L of the concave part 2212. Alternatively, in FIG. 2C, the encapsulation layer surface 221 has a convex part 2211 and a concave part 2212, the convex part 2211 has a highest point H, and the concave part 2212 has a lowest point L. A vertical distance between the highest point H and the lowest point L is equal to or less than 15 µm, and the grinding line FS is lower than the lowest point L of the concave part 2212.

Figure 2D:
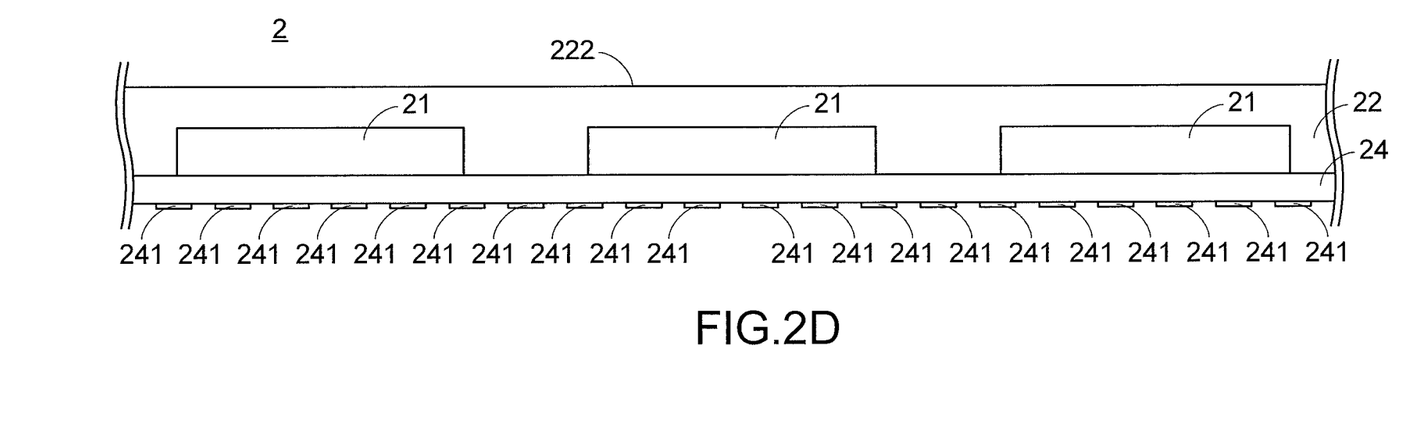
FIG. 2D is a sectional view of a first embodiment of surface treatment on an encapsulation layer according to the present invention.

Subsequently, referring to FIG. 2D, FIG. 2D is a sectional view of a first embodiment of surface treatment on an encapsulation layer according to the present invention. In FIG. 2D, after the plane grinding step is performed on the encapsulation layer surface 221 of the fingerprint sensing die connecting board 2, a composition plane 222 is formed at a position flush with the grinding line FS (as shown in FIG. 2B or FIG. 2C).

Figure 3A:
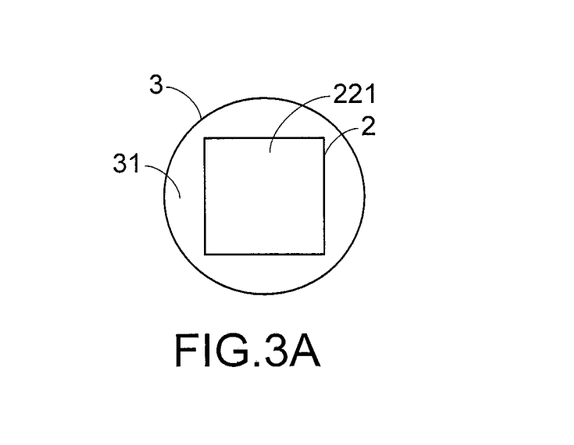
FIG. 3A and FIG. 3B are schematic diagrams of implementations of plane grinding according to the present invention.
Figure 3B:
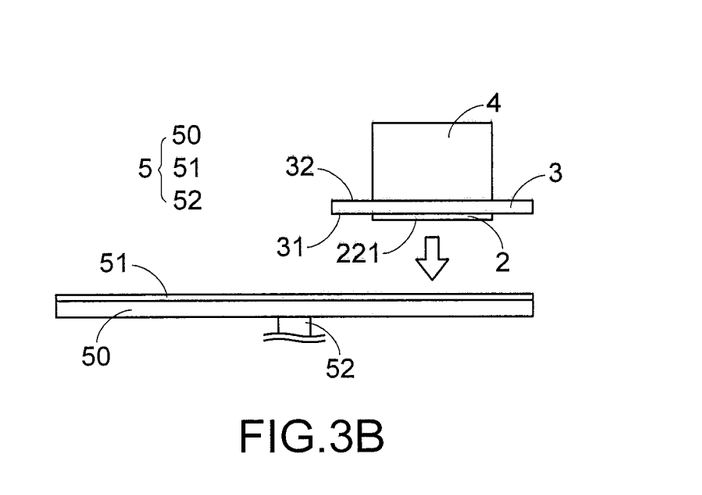

Referring to FIG. 3A and FIG. 3B, FIG. 3A and FIG. 3B are schematic diagrams of implementations of plane grinding according to the present invention. In FIG. 3A, first, the fingerprint sensing die connecting board 2 is fixed on the lower surface of a disc 3, and the encapsulation layer surface 221 faces toward a direction the same as that toward which a first surface 31 faces. Subsequently, in FIG. 3B, a second surface 32 of the disc 3 is combined with a gravity unit 4, and the combined disc 3 and gravity unit 4 are fixed at a position above a grinding device 5. The grinding device 5 includes: a rotating disc 50, a grinding layer 51, and a rotating shaft 52. The encapsulation layer surface 221 of the fingerprint sensing die connecting board 2 fixed on the disc 3 may abut against the grinding layer 51 by means of a weight generated by the gravity unit 4, and when a motor (not shown in the figure) is started to drive the rotating shaft 52 to actuate the rotating disc 50 to rotate, the plane grinding step may be performed on the encapsulation layer surface 221 by using the grinding layer 51. A grinding nick generated on the encapsulation layer surface 221 during grinding may be effectively avoided by using the plane grinding step. In addition, the grinding layer 51 may be coarse sandpaper or fine sandpaper. The coarse sandpaper is used for performing a coarse grinding step on the encapsulation layer surface 221 to remove the convex part 2211 and concave part 2212 (as shown in FIG. 2B or FIG. 2C). The fine sandpaper is used for performing a polishing step of fine grinding on the composition plane 222 (as shown in FIG. 2D).

Figure 4A:
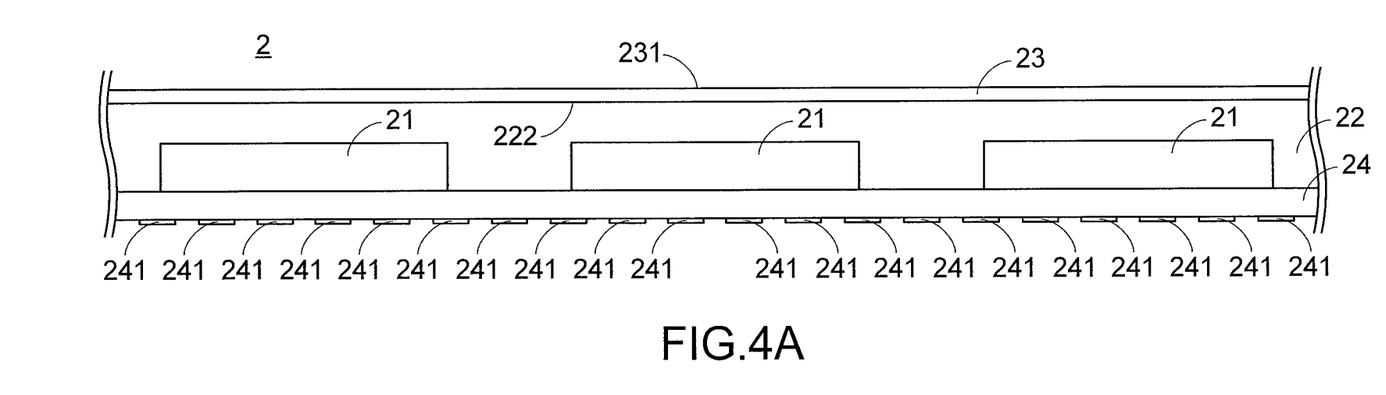
FIG. 4A is a sectional view of a first embodiment of imprint treatment on an encapsulation layer according to the present invention.

Referring to FIG. 4A, FIG. 4A is a sectional view of a first embodiment of imprint treatment on an encapsulation layer according to the present invention. In FIG. 4A, an imprint layer 23 is formed on the composition plane 222 of the encapsulation layer 22 of the fingerprint sensing die connecting board 2 in a manner of coating, imprinting, baking and heating, or exposing to ultraviolet light. The formed imprint layer 23 has a high-gloss surface 231, and the high-gloss surface 231 is a surface of high fineness and having a sense of gloss oil or a specular appearance. Subsequently, the fingerprint sensing die connecting board 2 is cut by laser to manufacture a single fingerprint recognition module. The imprint layer 23 of the present invention includes: a light-curable ink layer, a heat-curable ink layer, a hybrid ink layer, an ultraviolet-curable resin layer, a fingerprint-resistant coating layer, or a combination of the foregoing layers.

Figure 4B:
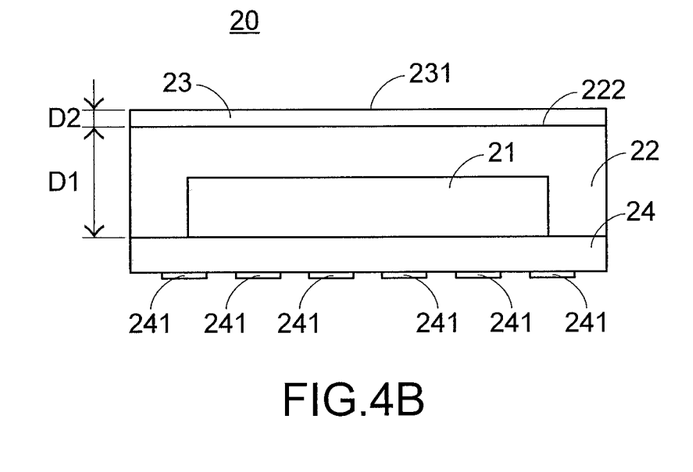
FIG. 4B is a sectional view of a first embodiment following a fingerprint recognition module according to the present invention.

Referring to FIG. 4B, FIG. 4B is a sectional view of a first embodiment following a fingerprint recognition module according to the present invention. In FIG. 4B, a fingerprint recognition module 20 manufactured by cutting the fingerprint sensing die connecting board 2 by laser includes: a fingerprint sensing die 21, an encapsulation layer 22, an imprint layer 23, and a substrate 24 having a plurality of weld legs 241. The fingerprint sensing die 21 is fixed on the substrate 24, the encapsulation layer 22 covers the fingerprint sensing die 21 and the substrate 24, and the encapsulation layer 22 has a composition plane 222. The imprint layer 23 has a high-gloss surface 231, and the imprint layer 23 is formed on the composition plane 222 of the encapsulation layer 22. Since the composition plane 222 of the encapsulation layer 22 does not have any structure of a convex part or a concave part, when the high-gloss surface 231 is viewed with eyes, a die mark resulting from the structures of a convex part and a concave part is no longer seen. In a preferred implementation of the present invention, a thickness D1 of the encapsulation layer 22 ranges from 0.25 mm to 0.85 mm, and a thickness D2 of the imprint layer 23 ranges from 28 μm to 44 μm.

Figure 5A:
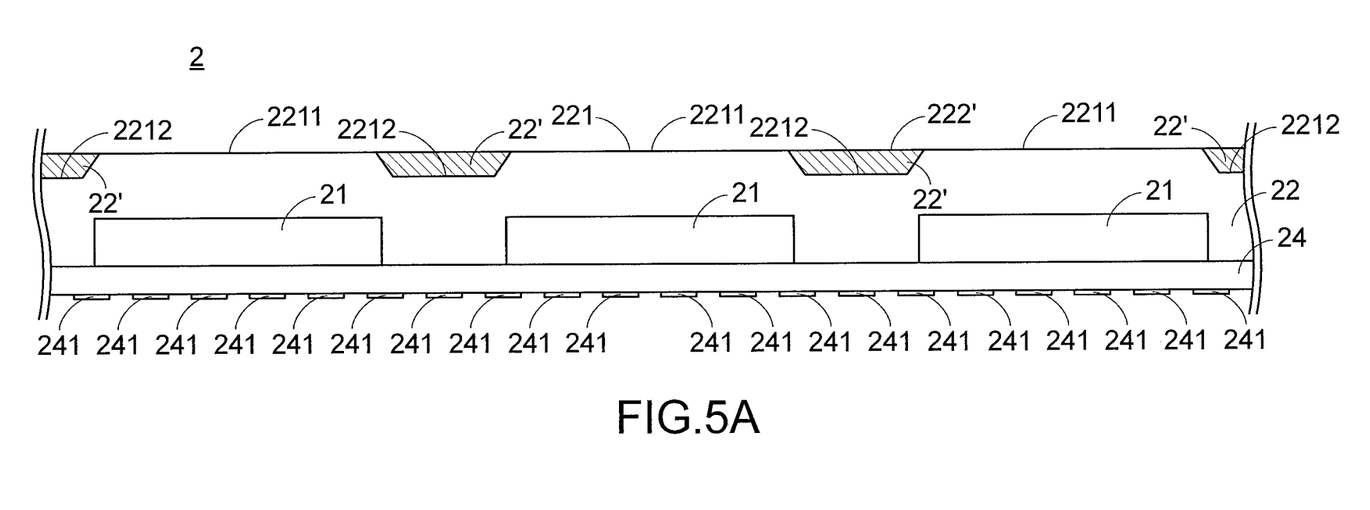
FIG. 5A is a sectional view of a second embodiment of a fingerprint sensing die connecting board according to the present invention.

Referring to FIG. 5A, FIG. 5A is a sectional view of a second embodiment of a fingerprint sensing die connecting board according to the present invention. The fingerprint sensing die connecting board 2, the fingerprint sensing dies 21, the encapsulation layer 22, the encapsulation layer surface 221, the convex part 2211, the concave part 2212, the substrate 24, the weld leg 241 are the same as those in FIG. 2A, and are not described herein in detail again. The only difference is that the concave part 2212 is filled with a filling material 22' whose material is the same as that of the encapsulation layer 22 to form a composition plane 222' on the encapsulation layer surface 221, and the coarse grinding step or polishing step of fine grinding may be further performed on the formed composition plane 222' by using the grinding device 5 in FIG. 3B. The filling material 22' is an EMC material or another material including silicone or acrylic, and may be used during an encapsulation process.

Figure 5B:
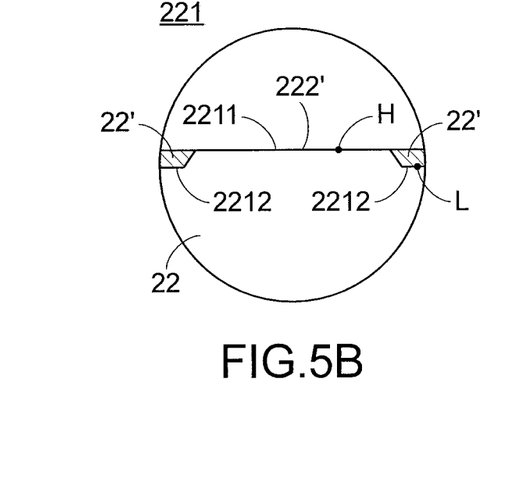
FIG. 5B and FIG. 5C are enlarged partial views of a second embodiment of surface treatment on an encapsulation layer according to the present invention.
Figure 5C:
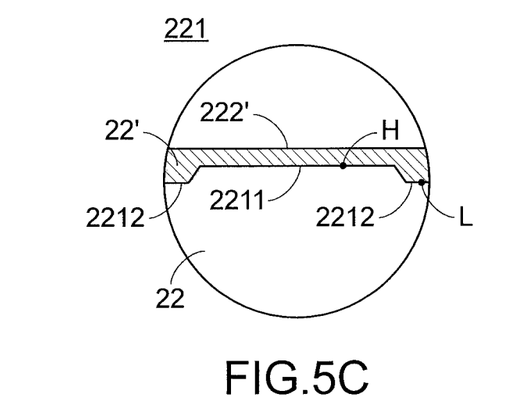

Referring to FIG. 5B and FIG. 5C, FIG. 5B and FIG. 5C are enlarged partial views of a second embodiment of surface treatment on an encapsulation layer according to the present invention. In FIG. 5B, the encapsulation layer surface 221 has a convex part 2211 and a concave part 2212, the convex part 2211 has a highest point H, and the concave part 2212 has a lowest point L. A vertical distance between the highest point H and the lowest point L is equal to or less than 15 μm, and the filling material 22' is filled in the concave part 2212 to form the composition plane 222' which is flush with the highest point H of the convex part 2211. Alternatively, in FIG. 5C, the encapsulation layer surface 221 has a convex part 2211 and a concave part 2212, the convex part 2211 has a highest point H, and the concave part 2212 has a lowest point L. A vertical distance between the highest point H and the lowest point L is equal to or less than and the filling material 22' is filled in the concave part 2212 to form the composition plane 222' which is higher than the highest point H of the convex part 2211.

Figure 5D:
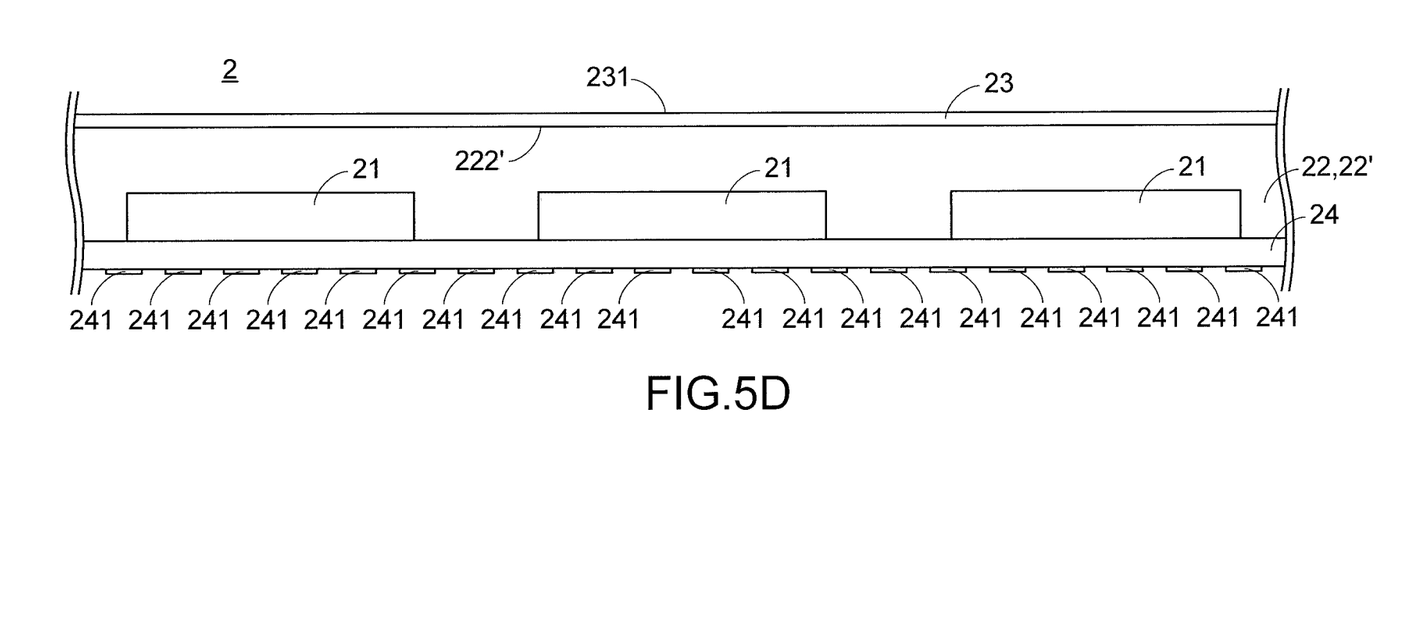
FIG. 5D is a sectional view of a second embodiment of imprint treatment on an encapsulation layer according to the present invention.

Referring to FIG. 5D, FIG. 5D is a sectional view of a second embodiment of imprint treatment on an encapsulation layer according to the present invention. In FIG. 5D, the composition plane 222' is formed by filling the filling material 22' into the concave part 2212 (as shown in FIG. 5B or FIG. 5C) of the encapsulation layer surface 221. Subsequently, an imprint layer 23 is formed on the composition plane 222' in a manner of coating, imprinting, baking and heating, or exposing to ultraviolet light, and the imprint layer 23 has a high-gloss surface 231. The imprint layer 23 and the high-gloss surface 231 are the same as those in FIG. 4A, and are not described herein in detail again.

Figure 5E:
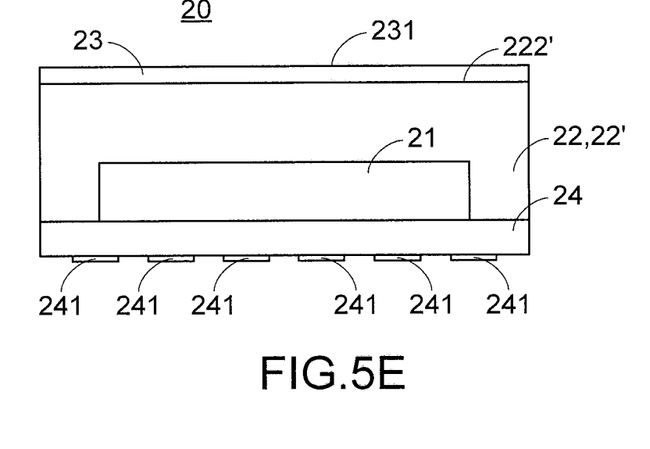
FIG. 5E is a sectional view of a second embodiment of a fingerprint recognition module according to the present invention.

Referring to FIG. 5E, FIG. 5E is a sectional view of a second embodiment of a fingerprint recognition module according to the present invention. In FIG. 5E, the fingerprint sensing die 21, the imprint layer 23, the high-gloss surface 231, the substrate 24, and the weld leg 241 in the fingerprint recognition module 20 are the same as those in FIG. 4B, and are not described herein in detail again. The only difference is that the composition plane 222' is formed by filling a filling material 22' into the concave part 2212 (as shown in FIG. 5B or FIG. 5C) of the encapsulation layer surface 221. The imprint layer 23 is formed on the composition plane 222'. In addition, in FIG. 5E, a thickness range of the encapsulation layer 22 having the filling material 22' and a thickness range of the imprint layer 23 are the same as those in FIG. 4B, and are not described herein again.

Figure 6:
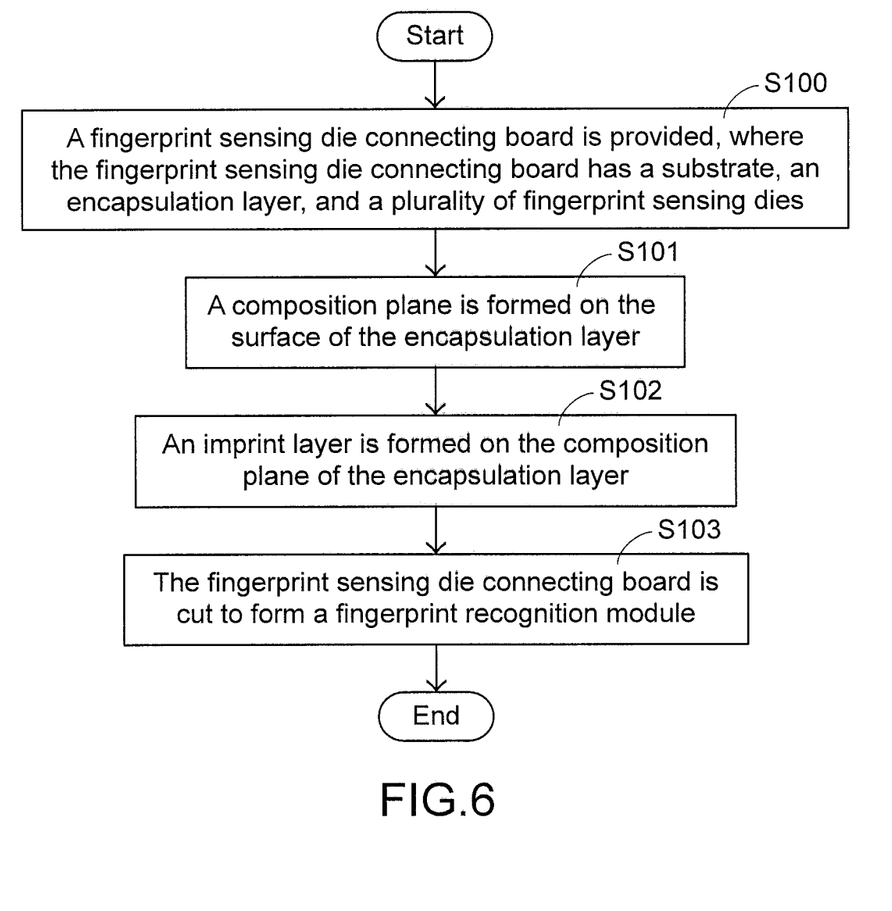
FIG. 6 is a flowchart of a manufacturing method for a fingerprint recognition module according to the present invention.

Referring to FIG. 2A to FIG. 2D, FIG. 4A and FIG. 4B, FIG. 5A to FIG. 5E, and FIG. 6 together, FIG. 6 is a flowchart of a manufacturing method for a fingerprint recognition module according to the present invention. In FIG. 6, first, a fingerprint sensing die connecting board 2 is provided, where the fingerprint sensing die connecting board 2 has a substrate 24, an encapsulation layer 22, and a plurality of fingerprint sensing dies 21 (step S100). In step S100, the substrate 24 has a plurality of weld legs 241, the encapsulation layer 22 has an encapsulation layer surface 221, and the encapsulation layer surface 221 has a plurality of convex parts 2211 and a plurality of concave parts 2212 resulting from a configuration position of the fingerprint sensing die 21. Subsequently, a composition plane 222 (222') is formed on the surface of the encapsulation layer 22 (step S101). In step S101, a plane grinding step is performed on the encapsulation layer surface 221 of the fingerprint sensing die connecting board 2 to remove the convex parts 2211 and the concave parts 2212, and a composition plane 222 is formed at the position of a grinding line FS, where the grinding line FS may be flush with or lower than a lowest point L of the concave part 2212; or the filling material 22' may be filled in the concave part 2212 to form a composition plane 222' which is flush with or higher than the highest point H of the convex part 2211, and the plane grinding step may be further performed on the formed composition plane 222'. A material of the filling material 22' is the same as a material of the encapsulation layer 22.

Still subsequently, an imprint layer is formed on the composition plane 222 (222') of the encapsulation layer 22 (Step S102). In step S102, an imprint layer 23 is formed on the composition plane 222 (222') of the encapsulation layer 22 of the fingerprint sensing die connecting board 2 in a manner of coating, imprinting, baking and heating, or exposing to ultraviolet light, and the imprint layer 23 has a high-gloss surface 231. The high-gloss surface 231 is a surface of high fineness and having a sense of gloss oil or a specular appearance. The imprint layer 23 may be a light-curable ink layer, a heat-curable ink layer, a hybrid ink layer, an ultraviolet-curable resin layer, a fingerprint-resistant coating layer, or a combination of the foregoing layers.

Finally, the fingerprint sensing die connecting board 2 is cut to form a fingerprint recognition module 20 (step S103). In step S103, the fingerprint sensing die connecting board 2 is cut by laser to form a single fingerprint recognition module 20. The fingerprint recognition module 20 includes: a fingerprint sensing die 21, an encapsulation layer 22 (22, 22'), an imprint layer 23, and a substrate 24 having a plurality of weld legs 241. The imprint layer 23 is formed on the composition plane 222 (222') of the encapsulation layer 22 and has a high-gloss surface 231. Since the composition plane 222 (222') of the encapsulation layer 22 does not have any structure of a convex part or a concave part, when the high-gloss surface 231 is viewed with eyes, a die mark resulting from the structures of a convex part and a concave part is no longer seen. A thickness D1 of the encapsulation layer 22 of the fingerprint recognition module 20 ranges from 0.25 mm to 0.85 mm, and a thickness D2 of the imprint layer 23 of the fingerprint recognition module 20 ranges from 28 μm to 44 μm.

Compared with the prior art, in the present invention, a structure of a convex part or a concave part on an encapsulation layer surface resulting from a configuration position of a fingerprint sensing die is removed in a manner such as plane grinding or material filling, and a composition plane is formed on the encapsulation layer surface. When an imprint layer is formed on the composition plane, a die mark resulting from structures of a convex part and a concave part on a high-gloss surface of the imprint layer may be effectively avoided, so as to keep aesthetic pleasure of consistency in an appearance of the fingerprint recognition module. Therefore, the present invention is indeed a creation having a high industrial value.

Various modifications made by a person skilled in the art on the present invention all fall within the protection scope of the appended claims.

What is claimed is:

1. A fingerprint recognition module, comprising:
    a substrate;
    a fingerprint sensing die, wherein the fingerprint sensing die is fixed on the substrate;
    an encapsulation layer, wherein the encapsulation layer covers the fingerprint sensing die and the substrate, and the encapsulation layer has a composition plane, wherein the composition plane is formed by means of a plane grinding step; and
    an imprint layer, wherein
    the imprint layer is formed on the composition plane.

2. The fingerprint recognition module according to claim 1, wherein the imprint layer has a high-gloss surface and the high-gloss surface does not have a die mark.

3. The fingerprint recognition module according to claim 1, wherein the encapsulation layer is made of an epoxy molding compound (EMC) material.

4. The fingerprint recognition module according to claim 1, wherein a thickness of the encapsulation layer ranges from 0.25 mm to 0.85 mm.

5. The fingerprint recognition module according to claim 1, wherein a thickness of the imprint layer ranges from 28 μm to 44 μm.

6. The fingerprint recognition module according to claim 1, wherein the imprint layer comprises: a light-curable ink layer, a heat-curable ink layer, a hybrid ink layer, an ultraviolet-curable resin layer, or a fingerprint-resistant coating layer.

7. The fingerprint recognition module according to claim 1, wherein the substrate has a plurality of weld legs.

8. A manufacturing method for a fingerprint recognition module, comprising the following steps:
    (a). providing a fingerprint sensing die connecting board, wherein the fingerprint sensing die connecting board has a substrate, an encapsulation layer, and a plurality of fingerprint sensing dies;
    (b). forming a composition plane on a surface of the encapsulation layer, wherein in step (b), the composition plane is formed by means of a plane grinding step;
    (c). forming an imprint layer on the composition plane of the encapsulation layer; and
    (d). cutting the fingerprint sensing die connecting board to form a fingerprint recognition module.

9. A fingerprint recognition module, comprising:
    a substrate;
    a fingerprint sensing die, wherein the fingerprint sensing die is fixed on the substrate;
    an encapsulation layer, wherein the encapsulation layer covers the fingerprint sensing die and the substrate, and the encapsulation layer has a composition plane, wherein a surface of the encapsulation layer has at least one concave part and at least one convex part, and a filling material is filled in the at least one concave part to form the composition plane; and
    an imprint layer, wherein
    the imprint layer is formed on the composition plane.

10. The fingerprint recognition module according to claim 9, wherein a material of the filling material is the same as a material of the encapsulation layer.

11. A manufacturing method for a fingerprint recognition module, comprising the following steps:
    (a). providing a fingerprint sensing die connecting board, wherein the fingerprint sensing die connecting board has a substrate, an encapsulation layer, and a plurality of fingerprint sensing dies;
    (b). forming a composition plane on a surface of the encapsulation layer, wherein a surface of the encapsulation layer has at least one concave part and at least one convex part, and a filling material is filled in the at least one concave part to form the composition plane;
    (c). forming an imprint layer on the composition plane of the encapsulation layer; and
    (d). cutting the fingerprint sensing die connecting board to form a fingerprint recognition module.

* * * * *